(12) United States Patent
Kitamura et al.

(10) Patent No.: US 6,184,558 B1
(45) Date of Patent: Feb. 6, 2001

(54) COMPARATOR HAVING REDUCED OFFSET VOLTAGE

(75) Inventors: Kenji Kitamura; Mika Shiiki; Jun Osanai, all of Chiba (JP)

(73) Assignee: Seiko Instruments Inc. (JP)

(*) Notice: Under 35 U.S.C. 154(b), the term of this patent shall be extended for 0 days.

(21) Appl. No.: 09/323,503

(22) Filed: Jun. 1, 1999

(30) Foreign Application Priority Data

May 29, 1998 (JP) ................................................ 10-149936

(51) Int. Cl.[7] ...................................................... H07L 29/78

(52) U.S. Cl. ............................................ 257/392; 257/402

(58) Field of Search ..................................... 257/392, 402

(56) References Cited

U.S. PATENT DOCUMENTS 4,809,227 * 2/1989 Suzuki et al. ........................ 365/168

* cited by examiner

Primary Examiner—David Hardy
(74) Attorney, Agent, or Firm—Adams & Wilks (57) ABSTRACT

An object of the invention is to reduce an offset voltage to realize a small occupying area in a comparator using MOS type transistors. The invention is characterized in that impurities are introduced into channel areas of MOS type transistors, and mobility of the MOS type transistor on a load side is smaller than mobility of the MOS type transistor on a differential side, and a mutual conductance gm of the MOS type transistor on the load side is smaller than a mutual conductance gm of the MOS type transistor on the differential side.

17 Claims, 7 Drawing Sheets

COMPARATOR HAVING REDUCED OFFSET VOLTAGE

BACKGROUND OF THE INVENTION

The present invention relates to a semiconductor device and more particularly relates to a comparator circuit formed using a MOS type transistor.

A comparator circuit formed using a MOS type transistor has conventionally been widely used. There is known a comparator having a MOS type transistor with a wide channel width and a long channel length to obtain a comparator having a small offset voltage.

However, in the conventional comparator circuit formed using the MOS type transistor, increasing the channel width and the channel length of the MOS type transistor is generally done to reduce the offset voltage. Therefore, a problem exists in which the area of the comparator is increased.

An object of the present invention is to provide a comparator having a small offset voltage and occupying a small area, which nobody has been able to achieve with a conventional comparator using a MOS type transistor.

SUMMARY OF THE INVENTION

The present invention uses the following means to achieve the above object.

(1) A mutual conductance gm of a MOS type transistor on a load side is set to be smaller than a mutual conductance gm of a MOS type transistor on a differential side in a comparator constructed by MOS type transistors.

(2) Mobility of the MOS type transistor on the load side is set to be smaller than mobility of the MOS type transistor on the differential side in this comparator.

(3) The impurity concentration of a channel area of the MOS type transistor on the load side is set to be higher than that of the MOS type transistor on the differential side in this comparator.

(4) A threshold voltage of the MOS type transistor on the load side is set to be higher than the threshold voltage of the MOS type transistor on the differential side in this comparator.

(5) The thickness of a gate oxide film of the MOS type transistor on the load side is set to be thicker than the thickness of a gate oxide film of the MOS type transistor on the differential side in this comparator.

(6) The MOS type transistor on the load side is a P-type transistor and the MOS type transistor on the differential side is an N-type transistor in this comparator.

(7) The MOS type transistor on the load side is an N-type transistor and the MOS type transistor on the differential side is a P-type transistor in this comparator.

(8) Impurities introduced into the channel areas of the MOS type transistors are phosphorus.

(9) The impurities introduced into the channel areas of the MOS type transistors are arsenic.

(10) The impurities introduced into the channel areas of the MOS type transistors are boron.

(11) The impurities introduced into the channel areas of the MOS type transistors are BF2.

(12) Two or more kinds of impurities are introduced into the channel areas of the MOS type transistors.

(13) No gate electrode overlaps with a source diffusive layer and a drain diffusive layer formed within a substrate only in the MOS type transistor on the load side in this comparator.

(14) A well area of a second conductivity type is formed within a silicon semiconductor substrate of a first conductivity type, and a MOS type transistor on this load side is formed within a well of this second conductivity type, and a MOS type transistor on this differential side is formed outside the well area of this second conductivity type.

(15) A well area of a second conductivity type is formed within a silicon semiconductor substrate of a first conductivity type, and the MOS type transistor on the differential side is formed within the well of the second conductivity type, and the MOS type transistor on the load side is formed outside the well area of the second conductivity type.

(16) well areas of second and third conductivity types are formed within a silicon semiconductor substrate of a first conductivity type, and the MOS type transistors on the differential side and the load side are formed within the respective wells.

DETAILED DESCRIPTION OF THE INVENTION

In a semiconductor device of the present invention, a comparator with reduced offset voltage and high accuracy having a small occupying area can be realized by using MOS type transistors.

Preferred embodiments of the present invention will be explained below with reference to the drawings.

A first embodiment of a semiconductor device according to the present invention will be shown. In a comparator shown in the circuit diagram of FIG. 1, each of two P-type transistors 102, 103 is used as a load transistor and each of two N-type transistors 107, 108 is used as a differential transistor. The comparator is also comprised of a power source terminal 101, an output terminal 104, a reference voltage terminal 105, an input terminal 106 and a ground terminal 109. A certain constant electric potential is applied to the reference voltage terminal 105. At this time, when an electric potential applied to the input terminal 106 is smaller than an electric potential applied to the reference voltage terminal 105, an electric potential applied to the power source terminal 101 is outputt from the output terminal 104. In contrast to this, when the electric potential applied to the input terminal 106 is greater than the electric potential applied to the reference voltage terminal 105, an electric potential applied to the ground terminal 109 is outputt from the output terminal 104. This change in output is called inversion.

Figure 1:
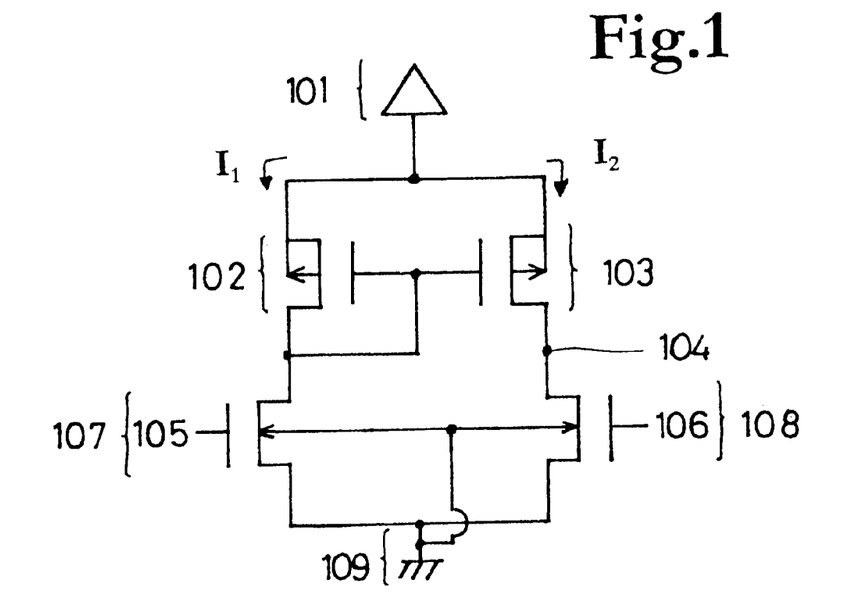
FIG. 1 is a circuit diagram of a comparator showing a first embodiment of a semiconductor device of the present invention in which an N-type transistor is used as a differential transistor and a P-type transistor is used as a load transistor.

In the case that the sizes of the P-type transistors 102 and 103 each used as a load transistor are equal to each other and the sizes of the N-type transistors 107 and 108 each used as a differential transistor are equal to each other, the output is inverted when the electric potential applied to the reference voltage terminal 105 and the electric potential applied to the input terminal 106 are equal to each other. However, the inversion is actually affected by processing accuracy and other tactors when the electric potential applied to the reference voltage terminal 105 and the electric potential applied to the input terminal 106 are not equal to each other. The difference between the electric potential applied to the reference voltage terminal 105 and A-he electric potential applied to the input terminal 106 at this time is called an offset voltage. The offset voltage is calculated by the following formula.

$$Voff-\Delta Vtn+\sqrt{(\alpha Kp/\beta Kn)}\times|\Delta Vtp|+(\sqrt{(\alpha/\beta)}-1)(Vref-Vb-Vtn) \quad (1)$$

In the formula (1), Voff denotes the offset voltage, and $\Delta Vtn$ denotes a difference in threshold voltage (hereinafter abbreviated as Vth) between the N-type transistors 107 and 108 constituting the differential transistors. $\Delta Vtp$ denotes a difference in Vth between the P-type transistors 102 and 103 constituting the load transistors, and Kn denotes a mutual conductance gm of each of the N-type transistors 107 and 108 constituting the differential transistor. Kp denotes a mutual conductance gm of each of the P-type transistors 102 and 103 constituting the load transistor. $\alpha$ denotes a ratio of the mutual conductances gm of the P-type transistors 102 and 103 constituting the load transistors. $\beta$ denotes a ratio of the mutual conductances gm of the N-type transistors 107 and 108 constituting the differential transistors. Vref denotes an electric potential (hereinafter abbreviated as vref) applied to the reference voltage terminal 105. Va denotes an electric potential applied to the power source voltage terminal 101, and Vb denotes an electric potential applied to the ground terminal 109. Vtn denotes a threshold voltage Vth of each of the N-type transistors 107 and 108 constituting the differential transistor, and Vtp denotes a Vth of each of the P-type transistors 102 and 103 constituting the load transistor.

The formula (1) is obtained as follows. Channel widths, channel lengths and Vths of the P-type transistors 102 and 103 constituting the load transistors in FIG. 1 are respectively set to be equal to each other, and channel widths, channel lengths and Vths of the N-type transistors 107 and 108 constituting the differential transistors are respectively set to be equal to each other. An electric current flowing through the P-type transistor 102 constituting the load transistor and the N-type transistor 107 constituting the differential transistor is denoted by I1. An electric current flowing through the P-type transistor 103 constituting the load transistor and the N-type transistor 108 constituting the differential transistor is denoted by I2. In this case, the electric currents I1 and I2 are expressed by the following formulas.

$$I1=Kp(Va-Vref-|Vtp|)^2=Kn(Vref-Vb-Vtn)^2 \quad (2)$$

$$I2 = \alpha Kp\{Va - Vdd - |Vtp - \Delta Vtp|\}^2 \quad (3)$$
$$= \beta Kn\{Vin - Vb - (Vtn - \Delta Vtn)\}^2$$

$$Vin=Vref-Voff \quad (4)$$

Here, Vin is an electric potential (hereinafter abbreviated as Vin) applied to the input terminal 106.

If the channel widths, the channel lengths, the Vths and the mutual conductance gm of the P-type transistors 102 and 103 constituting the load transistors are respectively equal to each other, and the channel widths, the channel lengths, the Vths and the mutual conductance gm of the N-type transistors 107 and 108 constituting the differential transistors are respectively equal to each other, the output is originally inverted when Vin=Vref. However, when an offset voltage exits, the output is inverted when the state of the formula (4) is obtained. When the output is inverted, I1=I2 is established so that the formula (2) is equal to the formula (3), and the formula (4) is substituted, assuming that the offset voltage exists. The formula (1) is obtained by solving the above formulas. It should be understood from the formula (1) that the mutual conductance gm of the load transistors are reduced and the mutual conductance gm of the differential transistors are increased to reduce the offset voltage.

Since the operative carrier in the P-type transistor is a positive hole, mobility of the P-type transistor is ½ to ⅓ times the mobility of the N-type transistor having an electron as a carrier. Since the mutual conductance gm is proportional to the mobility, the P-type transistor is arranged on a load side and the N-type transistor is arranged on a differential side so that the offset voltage can be reduced in comparison with a comparator constructed by the N-type transistor on the load side and the P-type transistor on the differential side.

Figure 3:
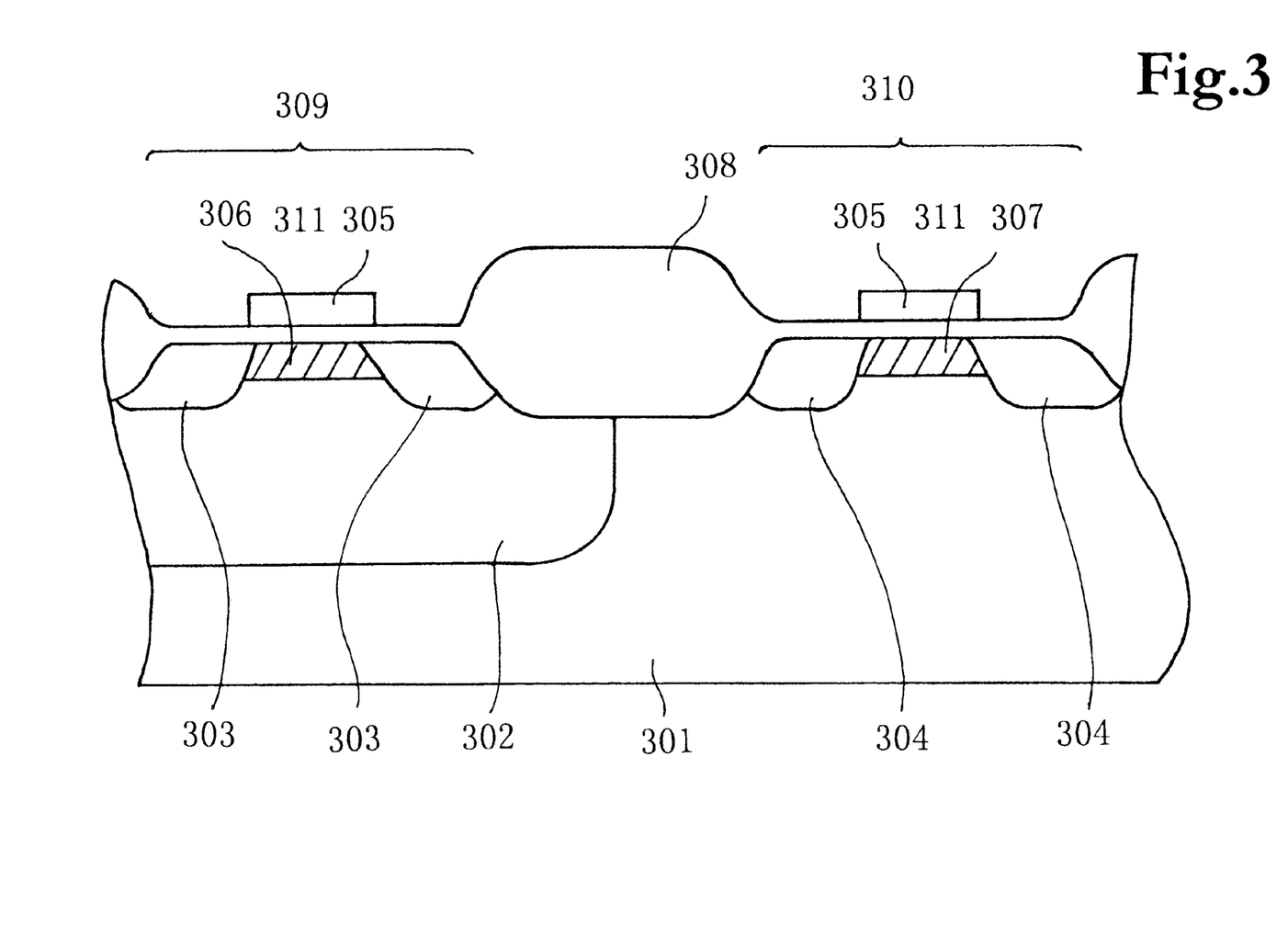
FIG. 3 is a schematic sectional view of a MOS transistor of the comparator circuit shown in the first embodiment of the semiconductor device of the present invention.

A second embodiment of the semiconductor device according to the present invention will be explained in detail. FIG. 3 is a schematic sectional view of a P-type transistor 309 as a load transistor and an N-type transistor 310 as a differential transistor in the semiconductor device of the present invention.

The N-type transistor 310 is comprised of a gate oxide film 311 and a polycrystal silicon gate electrode 305 formed on a P-type silicon semiconductor substrate 301, N+type diffusive layers 304 of high concentration called a source and a drain and being formed on a surface of the silicon substrate at both ends of the gate electrode, and a channel area 307 formed between these diffusive layers 304. The P-type transistor 309 is comprised of the gate oxide film 311 and another polycrystal silicon gate electrode 305 formed on the silicon substrate, P+type diffusive layers 303 of high concentration called a source and a drain and being formed on the surface of an N—type well layer 302 at both ends of the gate electrode, and a channel area 306 formed between these diffusive layers 303. A field oxide film 308 is formed between these elements to separate these elements from each other.

P-type impurities such as boron, $BF_2$, etc. or N-type impurities such as arsenic (As), phosphorus, etc. are introduced into the channel area of a MOS transistor. When the polycrystal silicon gate electrode is of the N-type, the P-type impurities of boron, $BF_2$, etc. are introduced into the channel areas of enhancement made and depletion mode P-channel MOS transistors. The P-type impurities of boron, $BF_2$, etc. are introduced into the channel area of an N-channel MOS transistor in the case of the enhancement mode, and the N-type impurities of As, phosphorus, etc. are introduced into the channel area of the N-channel MOS transistor in the case of the depletion mode. When the polycrystal silicon gate electrode is of the P-type, the N-type impurities of As, phosphorus, etc. are introduced into the channel area of a P-channel MOS transistor in the case of the enhancement mode, and the P-type impurities of boron, $BF_2$, etc. are introduced into this channel area of the P-channel MOS transistor in the case of the depletion mode. The N-type impurities of As, phosphorus, etc. are introduced into the channel areas of enhancement mode and depletion mode N-channel MOS transistors. At this time, impurity densities of the channel areas on the load side are set to be higher than those of the channel areas on the differential side so as to reduce mobility.

Figure 4:
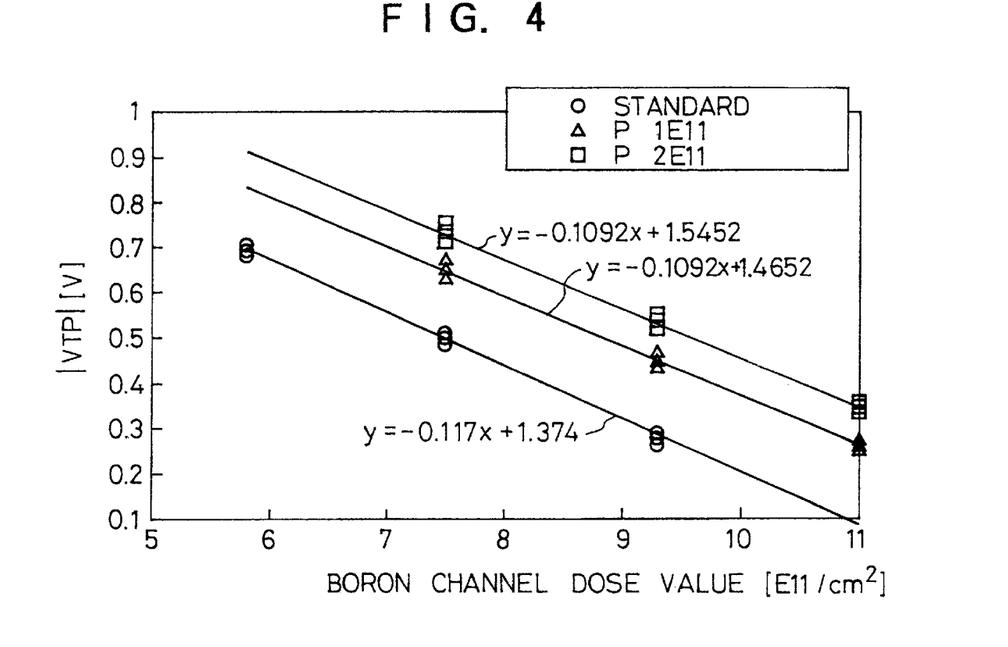
FIG. 4 is a graph showing the relation between a VTP of two or more kinds of channel impurities and a boron channel dose.
Figure 5:
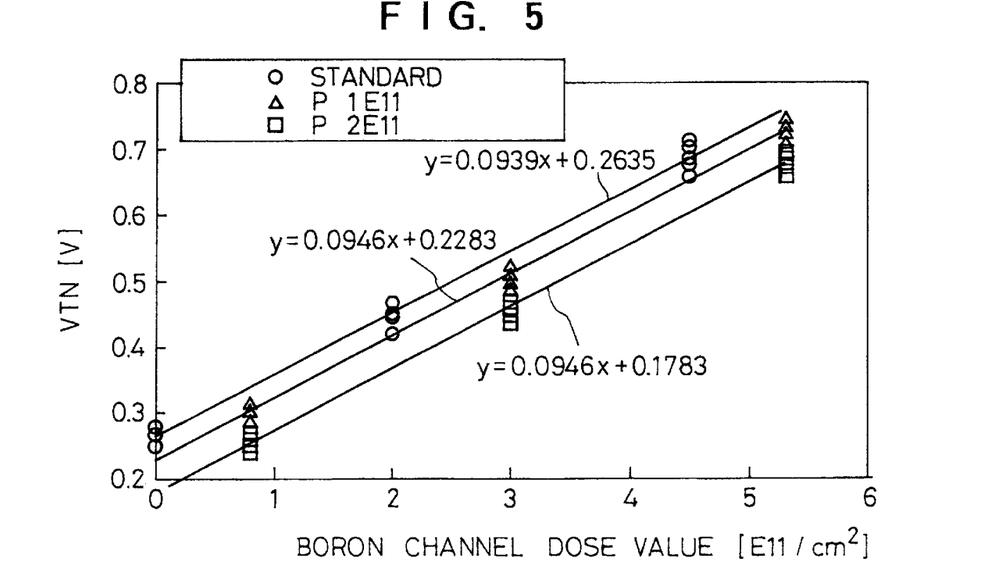
FIG. 5 is a graph showing the relation between a VTN of two or more kinds of channel impurities and a boron channel dose.

Mobility can be further reduced by introducing two or more different kinds of impurities into the channel area of the MOS transistor on the load side. In this case, P-type impurities and N-type impurities may be mixed with each other at any time. For example, after the N-type impurities are slightly introduced, the P-type impurities are introduced. Since the P-type and the N-type are electrically canceled, the MOS transistor can be set to have the same characteristics (threshold voltage) even when a large impurity amount (P-type) is introduced. FIG. 4 shows a a graph of threshold voltage of a P-type MOS transistor (VTP) vs. a boron channel dose. For example, when a VTP of 0.5 v is intended, conventionally, channel impurities (boron) of $7.47 \times 10^{11}$ [atmos/cm$^2$] are injected (in the standard), and channel impurities of $8.84 \times 10^{11}$ [atmos/cm$^2$] are injected when phosphorus of $1 \times 10^{11}$ [atmos/cm$^2$] is mixed with these channel impurities. Further, channel impurities of $9.57 \times 10^{11}$ [atmos/cm$^2$] are injected when phosphorus of $2 \times 10^{11}$ [atmos/cm$^2$] is mixed with these channel impurities. Namely, when the impurities of different poles are mixed with each other, a large amount of impurities can be introduced even in the case of the same VTP. FIG. 5 is a graph showing the relationship between the threshold voltage of an N-channel MOS transistor (VTN) vs. a boron channel dose. Similarly, when N-type impurities of phosphorus, etc. are mixed, a large amount of P-type impurities can be introduced even in the case of the same VTN. For example, when a VTN of 0.5 v is intended, conventionally, channel impurities (boron) of $2.52 \times 10^{11}$ [atmos/cm$^2$] are injected (in a standard), and channel impurities of $2.87 \times 10^{11}$ [atmos/cm$^2$] are injected when phosphorus of $1 \times 10^{11}$ [atmos/cm$^2$] is mixed with these channel impurities. Further, channel impurities of $3.40 \times 10^{11}$ [atmos/cm$^2$] are injected when phosphorus of $2 \times 10^{11}$ [atmos/cm$^2$] is mixed with these channel impurities.

Figure 6:
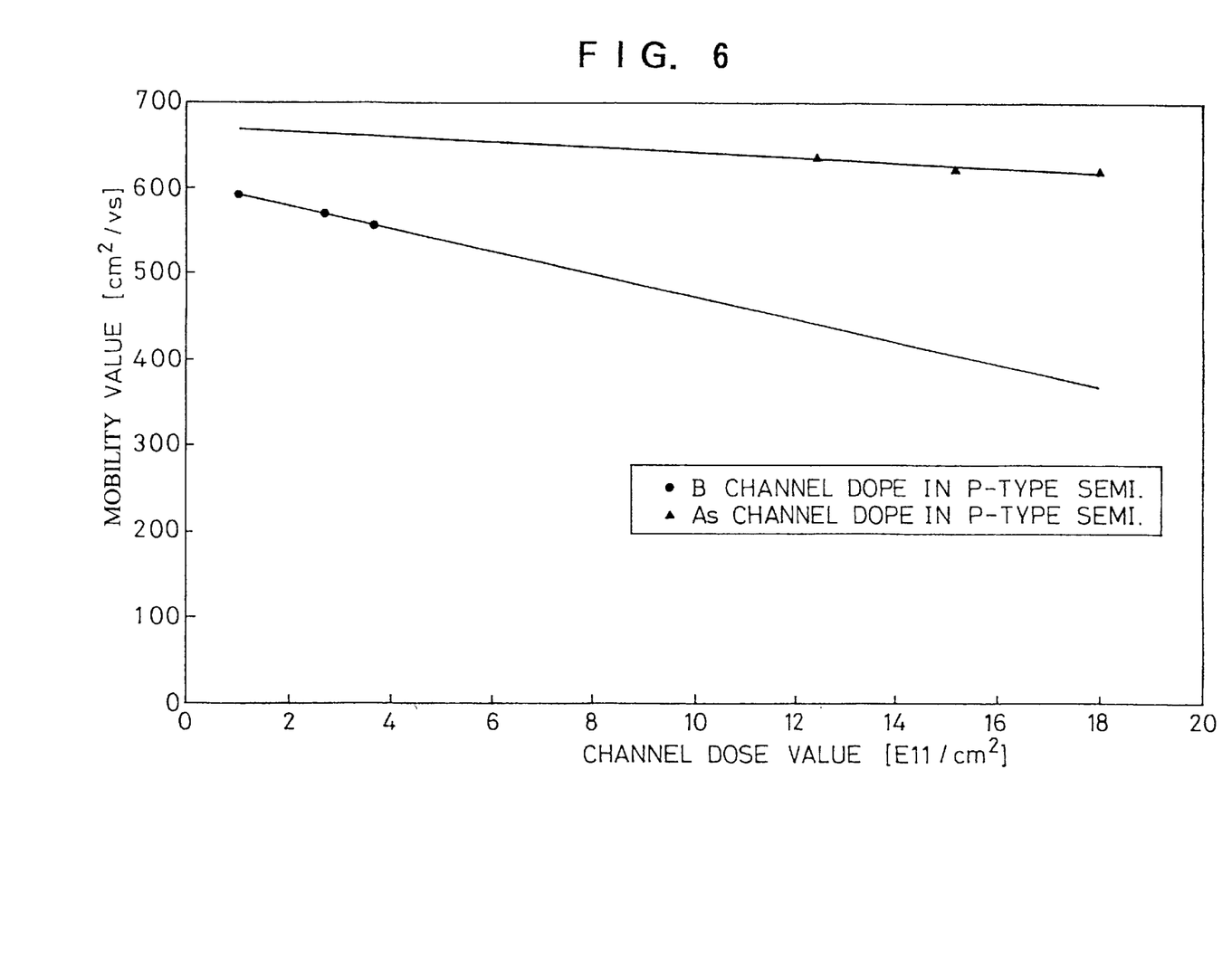
FIG. 6 is a graph showing the relation of the channel dose and mobility.

A change in mobility will next be explained when impurities are introduced into the channel area of the MOS type transistor. FIG. 6 shows the relation between a dose and mobility when boron as impurities of the same conductivity type as a P-type semiconductor substrate and arsenic as impurities of a conductivity type opposite to the conductivity type of the substrate are introduced into the channel area of the P-type semiconductor substrate. Mobility is reduced as the channel impurity dose is increased. It should be understood from this relation that mobility is easily changed by introducing impurities into the channel area. Thus, the mutual conductance gm of the MOS type transistor on the load side becomes smaller than the mutual conductance gm of the MOS type transistor on the differential side by setting a channel impurity concentration on the load side to be greater than that on the differential side so that an offset voltage can be reduced.

Figure 7:
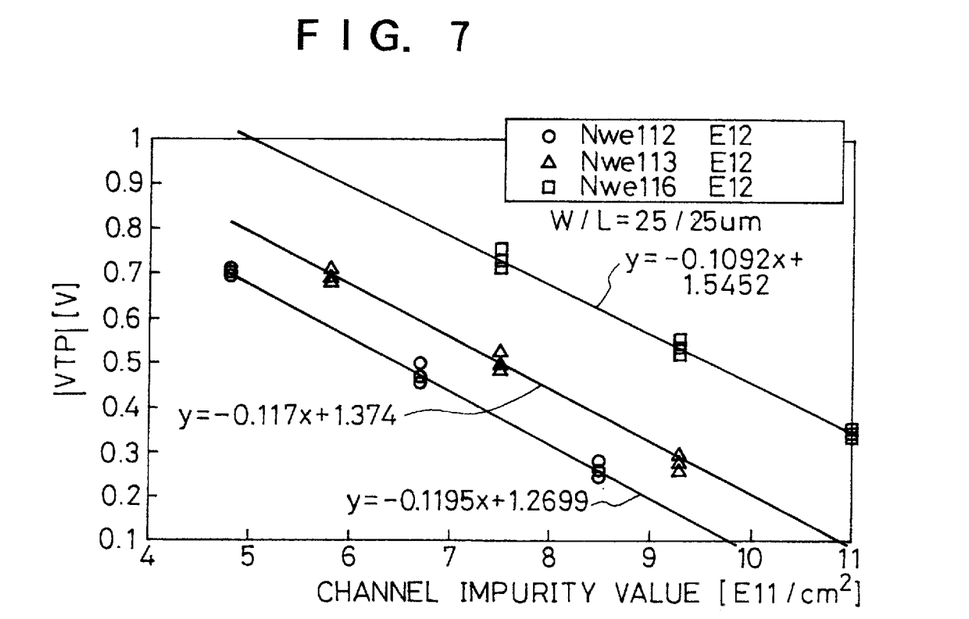
FIG. 7 is a graph showing the relation between the VTP and the channel dose of BF2 for each N-well concentration.
Figure 8:
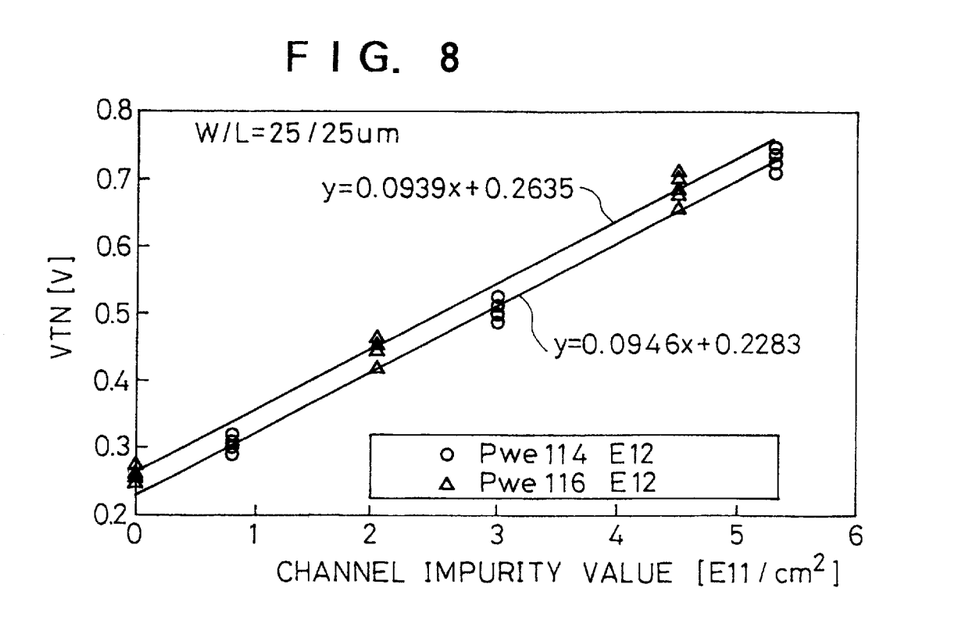
FIG. 8 is a graph showing the relation between the VTN and the channel dose of BF2 for each P-well concentration.
Figure 9:
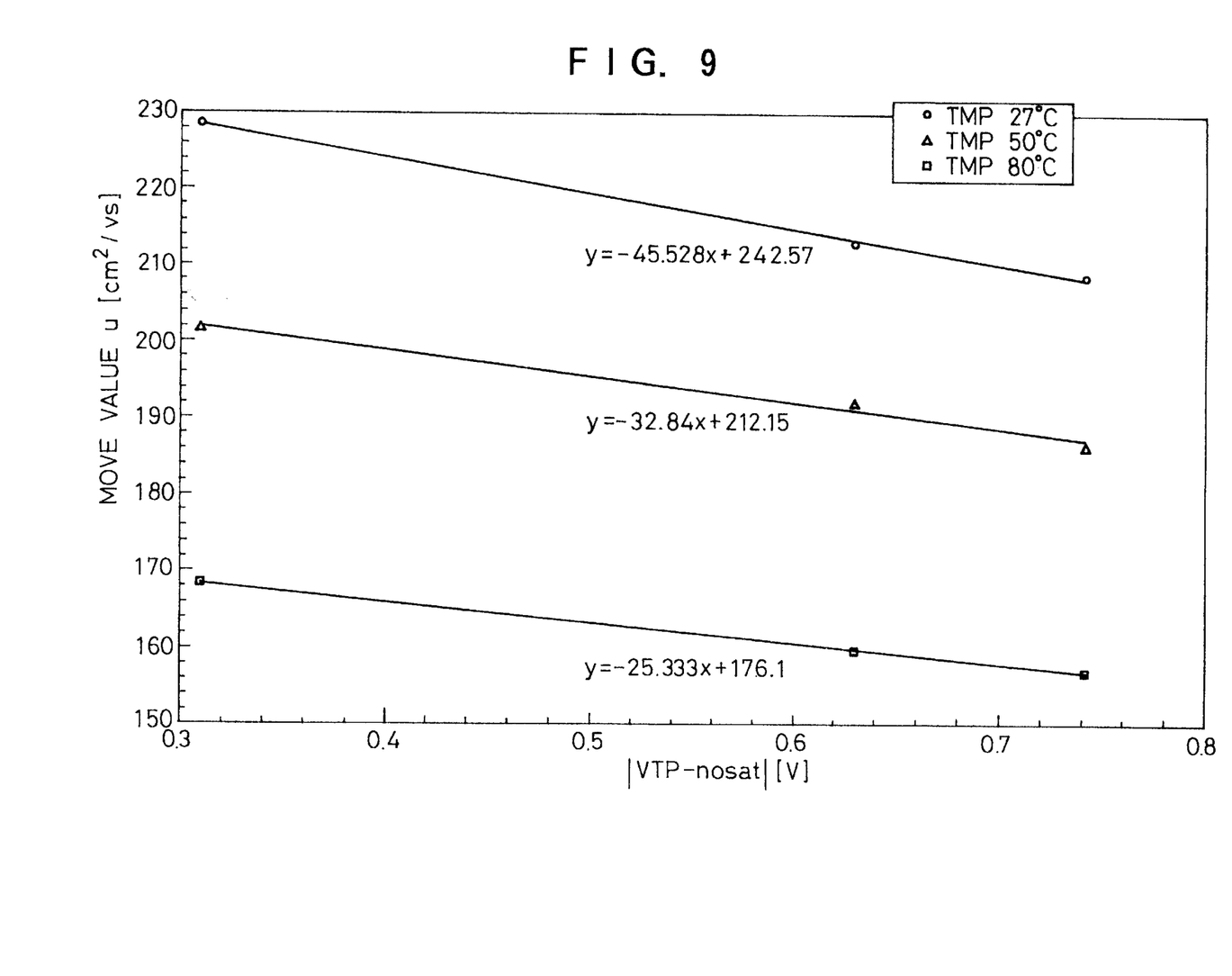
FIG. 9 is a graph showing the relation between an unsaturated VTP and mobility on the temperature basis.

A third embodiment of the semiconductor device according to the present invention will be explained in detail. The threshold voltage of a P-type transistor constituting a load transistor is set to be higher than the threshold voltage of an N-type transistor constituting a differential transistor. FIG. 7 shows the threshold voltage of the P-type transistor vs. a channel impurity amount. FIG. 8 shows the threshold voltage of the N-type transistor vs. a channel impurity amount. For example, when the threshold voltage of the P-type transistor is set to 0.6 v, it is necessary to set the channel impurity amount to $6.62 \times 10^{11}$ [atmos/cm$^2$]. As another example, when the threshold voltage of the N-type transistor is set to 0.5 v, it is necessary to set the channel impurity amount to $2.87 \times 10^{11}$ [atmos/cm$^2$]. The channel impurity amount is increased as the threshold voltage is increased. Namely, an offset voltage can be reduced when the threshold voltage of a MOS type transistor on the load side is set to be higher than the threshold voltage of the MOS type transistor on the differential side. It is preferable to set the threshold voltage of the P-type transistor to be higher. FIG. 9 shows the threshold voltage of the P-type transistor vs. mobility. It should be understood from FIG. 9 that mobility is reduced as the threshold voltage of the P-type transistor is increased.

It is effective to form the P-type transistor constituting the load transistor within a deep N-type well area so as to set the impurity concentration of a channel area of the P-type transistor constituting the load transistor to be higher than the impurity concentration of a channel area of the N-type transistor constituting the differential transistor. FIG. 7 shows VTP vs. channel impurity amount for each N-well concentration. For example, when the VTP is set to 0.5 v, it is necessary to set the amount of channel impurities (boron) to $6.44 \times 10^{11}$ [atmos/cm$^2$] in an N-well of $2 \times 10^{12}$ [atmos/cm$^2$], and $7.47 \times 10^{11}$ [atmos/cm$^2$] in an N-well of $3 \times 10^{12}$ [atmos/cm$^2$], and $9.57 \times 10^{12}$ [atmos/cm$^2$] in an N-well of $6 \times 10^{12}$ [atmos/cm$^2$]. The channel impurity amount is increased as the N-well concentration is increased.

If mobility of the P-type transistor constituting the load transistor is smaller than mobility of the N-type transistor constituting the differential transistor, both the P-type transistor constituting the load transistor and the N-type transistor constituting the differential transistor may be made in a well area. At this time, the difference between the impurity concentration of the channel area of the N-type transistor and the impurity concentration of the channel area of the P-type transistor can be made large. FIG. 8 shows VTN vs. channel impurity amount for each P-well concentration. For example, when the VTN is set to 0.45 v, it is necessary to set the channel impurity amount to $2.34 \times 10^{11}$ [atmos/cm$^2$] in a P-well of $4 \times 10^{12}$ [atmos/cm$^2$], and $1.99 \times 10^{11}$ [atmos/cm$^2$] in a P-well of $6 \times 10^{12}$ [atmos/cm$^2$]. Thus, as the P-well concentration is increased, the channel impurity amount can be reduced so that the difference in impurity concentration is increased.

The MOS type transistor on the load side is not necessarily made inthe well area. A P-type well may be made by using an N-type substrate and a P-type transistor constituting the load transistor may be made within the N-type silicon semiconductor substrate, and an N-type transistor constituting thedifferential transistor may be made within the P-type well. In this case, the impurity concentration of a channel area of the P-type transistor constituting the load transistor is set to be higher than the impurity concentration of a channel area of the N-type transistor constituting the differential transistor without fail.

A fourth embodiment of the semiconductor device according to the present invention will next be explained in detail. An offset voltage is reduced by setting the thickness of a gate oxide film of a MOS type transistor on a load side to be thicker than that of a MOS type transistor on a differential side. A mutual conductance gm is inversely proportional to the thickness of the gate oxide film. Therefore, when this thickness is increased, the mutual conductance gm is reduced. After an oxide film of, for example, 150 Å is formed on the entire face of a semiconductor substrate, the oxide film is selectively etched only in an area in which the MOS type transistor on the differential side is formed. The entire face of the substrate is again oxidized so that an oxide film of, for example, 200 Å is formed. Thus, the thickness of the gate oxide film of the MOS type transistor on the differential side is set to 200 Å of the oxide film finally oxidized. The gate oxide film is formed in the MOS type transistor on the load side such that the thickness of this gate oxide film is 150+200 Å, or about 350 Å in total. Accordingly, the mutual conductance gm of the MOS type transistor on the load side can be set to be smaller than that on the differential side.

Figure 10:
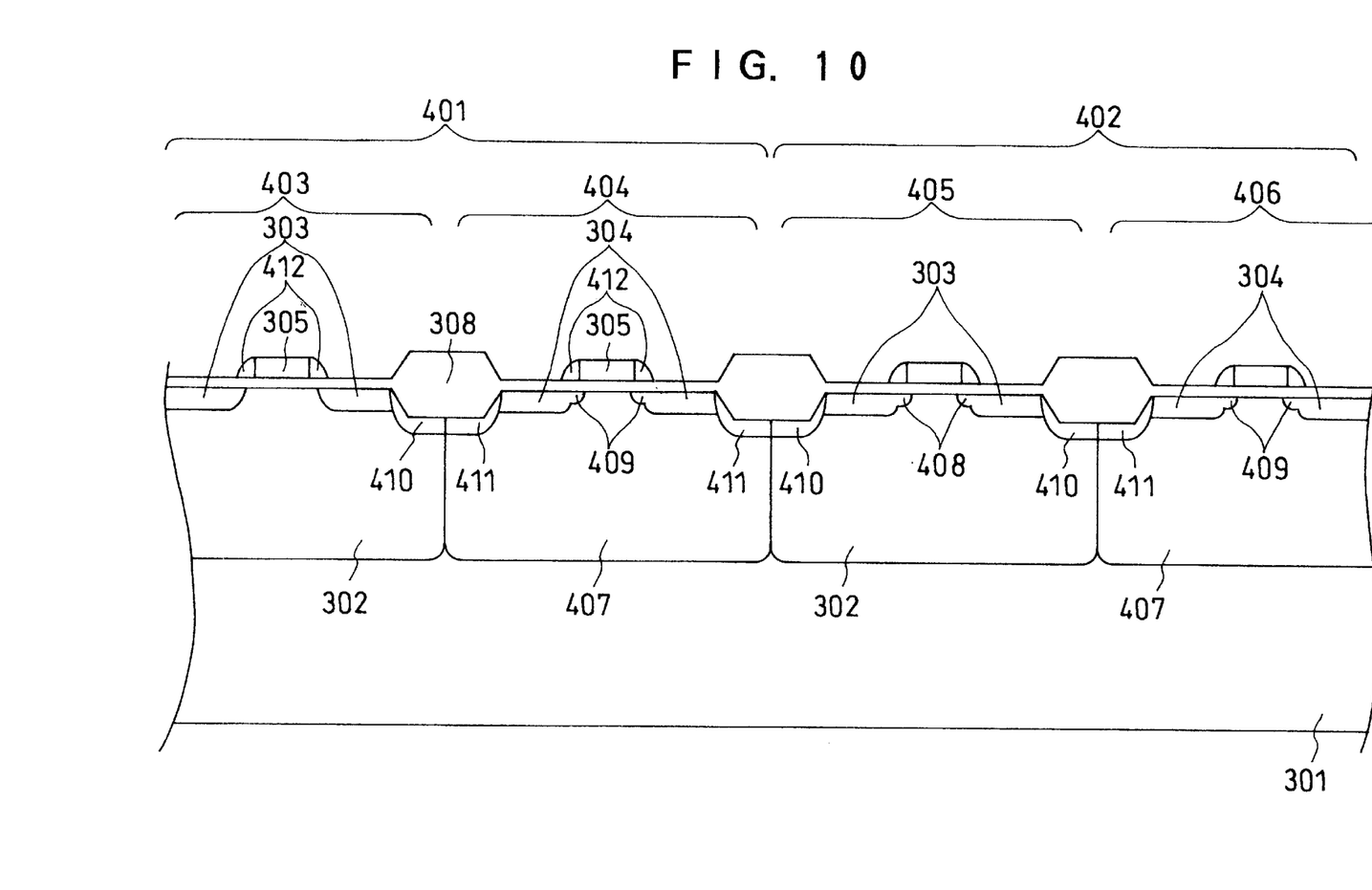
FIG. 10 is a schematic sectional view of a comparator circuit and a MOS transistor of a circuit except for the comparator circuit showing a fifth embodiment of the semiconductor device of the present invention.

A fifth embodiment of the semiconductor device according to the present invention will next be explained in detail. FIG. 10 is a schematic sectional view of a MOS type transistor constituting a comparator circuit 401 within a power source IC, an LCD controller IC, etc., and a MOS type transistor of a circuit 402 other than the comparator circuit.

This comparator circuit 401 is constructed by an N-type MOS transistor on a differential side and a P-type MOS transistor on a load side. In the N-type MOS transistor 404 on the differential side, a side spacer 412 is formed at both ends of a gate electrode 305. A low concentration diffusive layer (N-LDD) 409 is formed below the side spacer within a silicon substrate. A high concentration diffusive layer (N+diffusive layer) 304 as a source and a drain is formed on a side of this low concentration diffusive layer 409. Thus, a so-called N-type LDD transistor is formed. An N-type MOS transistor 406 of the circuit 402 other than the comparator circuit is also the same LDD transistor.

In the P-type MOS transistor 403 on the load side, another side spacer 412 is similarly formed at both ends of another gate electrode. However, no low concentration diffusive layer (LED) is formed below the side spacer within the silicon substrate, and a high concentration diffusive layer (P+diffusive layer) 203 called a source drain is formed without overlapping with the gate electrode. When the P-type MOS transistor is constructed in this way, an LDD portion functions as a resistor when the P-type MOS transistor is operated. Accordingly, mutual conductance gm can be reduced without increasing transistor size. In contrast to this, a P-type MOS transistor 405 in the circuit 402 other than the comparator circuit forms an LDD 408 and operating speed (mutual conductance gm) of this P-type MOS transistor 405 is not reduced. Thus, the mutual conductance gm is reduced only in the MOS type transistor 403 on the load side of the comparator circuit within an IC, and an offset voltage can be reduced without affecting the characteristics of the other circuits.

A sixth embodiment of the semiconductor device in the present invention will be explained in detail. In the above explanations, the P-type transistor is arranged on the load side and the N-type transistor is arranged on the differential side. However, the following description shows an example of a comparator circuit in which the P-type transistor is used as a differential transistor and the N-type transistor is used as a load transistor.

Figure 2:
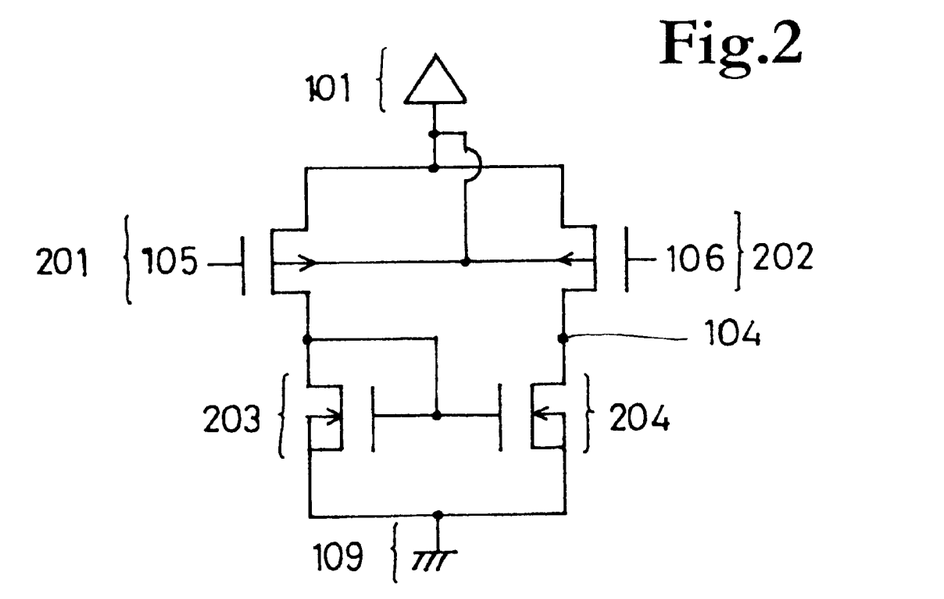
FIG. 2 is a circuit diagram of a comparator showing a sixth embodiment of the semiconductor device of the present invention in which the P-type transistor is used as a load transistor and the N-type transistor is used as a differential transistor.

In a comparator shown in FIG. 2, two N-type transistors 203, 204 are used as load transistors and two P-type transistors 201, 202 are used as differential transistors. An explanation of the other portions of this comparator is omitted by designating these portions by the same reference numerals as in FIG. 1. Similar to FIG. 1, an offset voltage is calculated in FIG. 2 and is expressed by the following formula.

$$Voff = |\Delta Vtp| + \sqrt{(\beta Kn/\alpha Kp)} * \Delta Vtn + (\sqrt{(\beta/\alpha)} - 1)(Va - Vref - |Vtp|) \quad (5)$$

Here, Vtp denotes a Vth of the P-type transistor 201 constituting the differential transistor, and Vtn denotes a Vth of the N-type transistor 203 constituting the load transistor. ΔVtp denotes the difference in Vth between the P-type transistors 201 and 202 constituting the differential transistors. ΔVtn denotes the difference in Vth between the N-type transistors 203 and 204 constituting the load transistors. Kp denotes a mutual conductance gm of the P-type transistor 201 constituting the differential transistor. Kn denotes a mutual conductance gm of the N-type transistor 203 constituting the load transistor. α denotes a ratio of the mutual conductances gm of the P-type transistors 201, 202 constituting the differential transistors. β denotes a ratio of the mutual conductances gm of the N-type transistors 203, 204 constituting the load transistors. It should be understood from the formula (5) that it is sufficient to reduce the mutual conductance gm of the load transistor and increase the mutual conductance gm of the differential transistor in order to reduce the offset voltage. Accordingly, when the offset voltage is reduced in such a circuit, it is sufficient to take a measure for reducing the mutual conductance gm of the N-type transistor constituting the load transistor mentioned above.

As mentioned above, according to the present invention, when the mutual conductance gm of the MOS type transistor on the load side is set to be smaller than the mutual conductance gm of the MOS type transistor on the differential side in the comparator using the MOS type transistors, the offset voltage can be reduced without increasing a transistor size. Thus, a comparator having a small offset voltage can be provided in a small occupying area, which has been unable to achieve in the conventional comparator. Further, such a significant effect can be obtained in many ICs that the cost can be reduced, and that the comparator may be applied also to an IC that has resriction in chip size, etc.

What is claimed is:

1. A comparator circuit comprising: a load side having a load side MOS transistor; and a differential side having a differential side MOS transistor; wherein a mutual conductance (gm) of the load side MOS transistor on the load side is smaller than a mutual conductance (gm) of the differential side MOS transistor on the differential side.

2. A comparator circuit according to claim 1; wherein carrier mobility of the load side MOS transistor on the load side is smaller than that of the differential side MOS transistor on the differential side.

3. A comparator circuit according to claim 1; wherein the impurity concentration of a channel area of the load side MOS transistor on the load side is larger than that of the differential side MOS transistor on the differential side.

4. A comparator circuit according to claim 1; wherein a threshold voltage of the load side MOS transistor on the load side is higher than that of the differential side MOS transistor on the differential side.

5. A comparator circuit according to claim 1; wherein the thickness of a gate oxide film formed on the load side MOS transistor on the load side is greater than the thickness of a gate oxide film formed on the differential side MOS transistor on the differential side.

6. A comparator circuit according to claim 1; wherein the load side MOS transistor on the load side is a P-type transistor and the differential side MOS transistor on the differential side is an N-type transistor.

7. A comparator circuit according to claim 1; wherein the load side MOS transistor on the load side is an N-type transistor and the differential side MOS transistor on the differential side is a P-type transistor.

8. A comparator circuit according to claim 3; wherein the impurities introduced into the channel areas of the load side and the differential side MOS transistors are phosphorus.

9. A comparator circuit according to claim 3; wherein the impurities introduced into the channel areas of the load side and the differential side MOS transistors are arsenic.

10. A comparator circuit according to claim 3; wherein the impurities introduced into the channel areas of the load side and the differential side MOS transistors are boron.

11. A comparator circuit according to claim 3; wherein the impurities introduced into the channel areas of the load side and the differential side MOS transistors are $BF_2$.

12. A comparator circuit according to claim 3; wherein two or more different kinds of impurities are introduced into the channel areas of at least one of the load side and the differential side MOS transistors.

13. A comparator circuit according to claim 1; wherein a gate electrode of the load side MOS transistor is laterally spaced from a source diffusive region and a drain diffusive region formed within a substrate of the load side MOS transistor on the load side so that the gate electrode does not overlap the source and drain diffusive layers.

14. A comparator circuit according to claim 1; further comprising a semiconductor substrate having a first conductivity type, and a well area of a second conductivity type formed within the semiconductor substrate of the first conductivity type; wherein the load side MOS transistor on the load side is formed within the well area of the second conductivity type, and the differential side MOS transistor on the differential side is formed in the semiconductor substrate outside the well area of the second conductivity type.

15. A comparator circuit according to claim 1; further comprising a semiconductor substrate having a first conductivity type, and a well area of a second conductivity type formed within the semiconductor substrate of the first conductivity type; wherein the differential side MOS transistor on the differential side is formed within the well area of the second conductivity type, and the load side MOS transistor on the load side is formed in the semiconductor substrate outside the well area of the second conductivity type.

16. A comparator according to claim 1; further comprising a semiconductor substrate having a first conductivity type, and well areas of second and third conductivity types formed within the semiconductor substrate of the first conductivity type; wherein the load side and the differential side MOS transistors on the differential side and the load side are formed within the respective well areas.

17. A comparator circuit according to claim 1; wherein the load side and the differential side MOS transistors are formed in a single semiconductor substrate.

* * * * *